United States Patent
Woerz et al.

(10) Patent No.: US 7,820,358 B2
(45) Date of Patent: Oct. 26, 2010

(54) PHOTO-RESIST MATERIAL STRUCTURE AND METHOD OF PRODUCING THE SAME

(75) Inventors: Andreas Woerz, Kelheim (DE); Erwin Steinkirchner, Straubing (DE)

(73) Assignee: Infineon Technologies AG, Neubiberg (DE)

( * ) Notice: Subject to any disclaimer, the term of this patent is extended or adjusted under 35 U.S.C. 154(b) by 621 days.

(21) Appl. No.: 11/773,422

(22) Filed: Jul. 4, 2007

(65) Prior Publication Data

US 2009/0011360 A1 Jan. 8, 2009

(51) Int. Cl.
*G03F 7/00* (2006.01)
*G03F 7/20* (2006.01)
*G03F 7/40* (2006.01)

(52) U.S. Cl. .............. 430/270.1; 430/311; 430/312; 430/330; 430/331; 430/394

(58) Field of Classification Search .......... 430/270.1, 430/311, 312, 394
See application file for complete search history.

(56) References Cited

U.S. PATENT DOCUMENTS

| | | | | |
|---|---|---|---|---|
| 6,582,890 | B2* | 6/2003 | Dentinger et al. | 430/322 |
| 7,129,025 | B2* | 10/2006 | Tseng et al. | 430/312 |
| 7,229,745 | B2* | 6/2007 | Lamarre | 430/313 |
| 2005/0277064 | A1* | 12/2005 | Lamarre | 430/312 |

* cited by examiner

*Primary Examiner*—Amanda C. Walke
(74) *Attorney, Agent, or Firm*—Slater & Matsil, L.L.P.

(57) ABSTRACT

An apparatus includes a substrate and a photoresist material structure arranged adjacent to the substrate so that a cavity is formed between the substrate and the photoresist material structure. The cavity has an opening. The photoresist material structure includes a frame portion disposed on a main side of the substrate and a cap portion spanning over a part of the main side of the substrate at a distance to the main side. The cap portion is formed in the first photoresist layer and the frame portion is formed in the second photoresist layer.

51 Claims, 11 Drawing Sheets

PHOTO-RESIST MATERIAL STRUCTURE AND METHOD OF PRODUCING THE SAME

TECHNICAL FIELD

This invention relates to an apparatus comprising a photo-resist material structure and a method of producing the same.

BACKGROUND

Photoresist materials are known.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
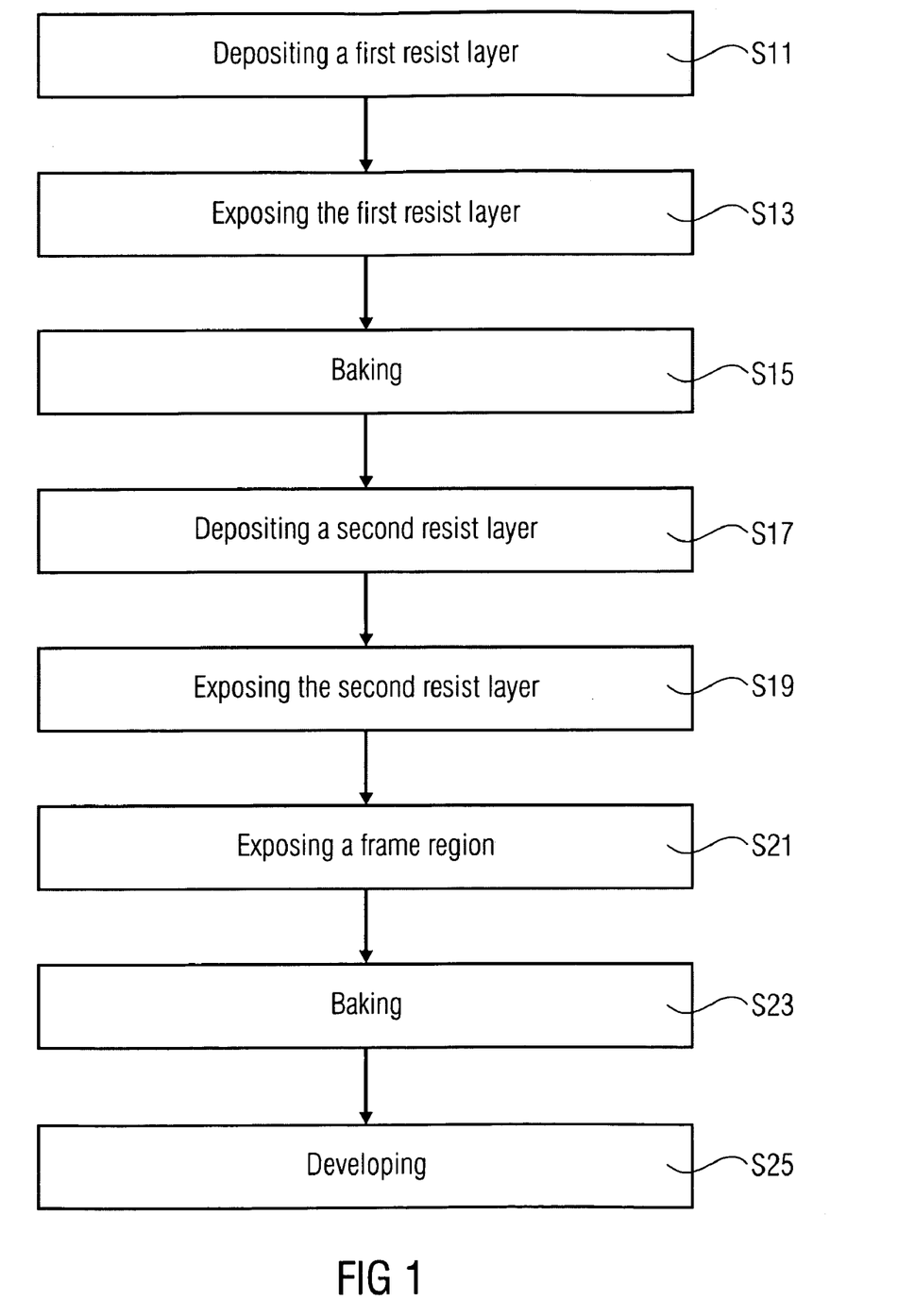
FIG. 1 shows a method of producing an apparatus with a cavity on a substrate.

FIG. 1 discusses a flow of a method for producing an apparatus comprising a photoresist material structure with several photoresist layers. In step S11 a first photoresist layer is deposited on a substrate wherein the first photoresist layer comprises a first photoresist material. The first photoresist material can for example be an SU-8-resist and can be transparent. In a step S13 the thus produced material structure is exposed such that a region of the first photoresist layer crosslinks in a first region and does not crosslink in a second region.

Figure 2A:
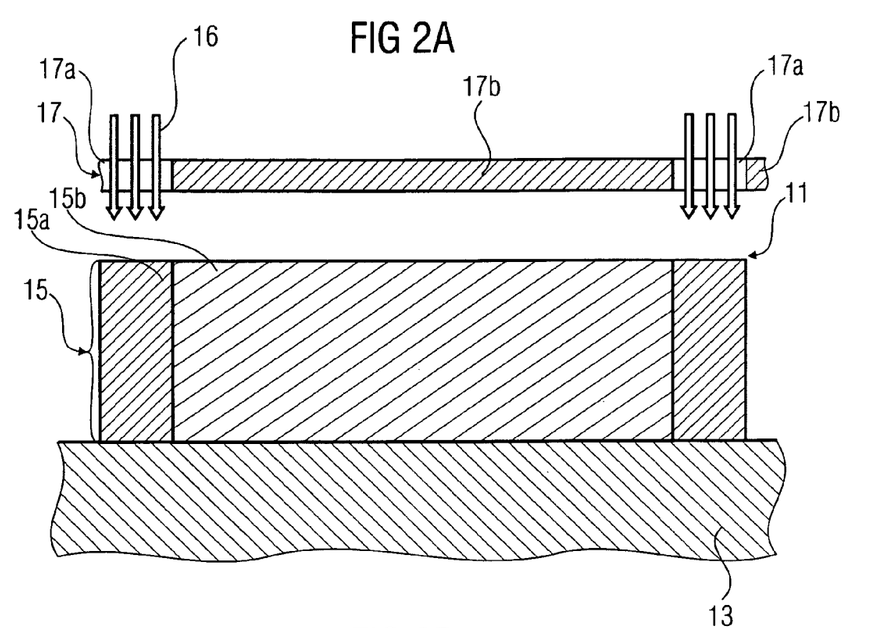
FIGS. 2a-2d show schematic cross-sectional views of the apparatus during a production by means of the method of producing according to an embodiment.
Figure 4A:
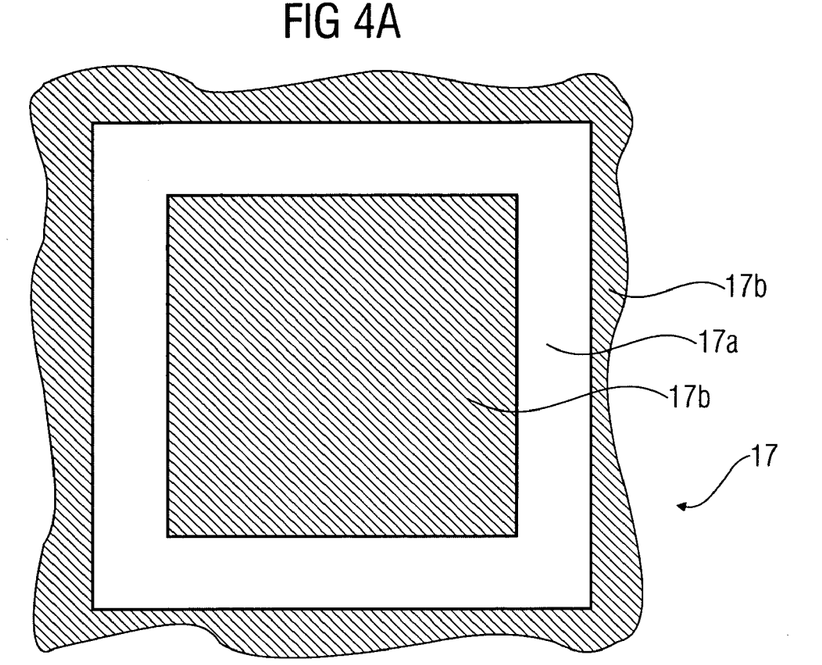
FIGS. 4a-4b depict top views on masks used in the method of producing discussed in FIG. 1.

FIG. 2a discloses a part of a material structure 11 with a substrate 13 and a first photoresist layer 15 deposited on the substrate 13. The substrate can for example comprise a semiconductor material such as silicon or a GaAs (GaAs=gallium-arsenide). The material structure 11 is exposed by a light 16, which can for example be an i-line-light generated by an i-line stepper. The light 16 penetrates the mask 17 in a first region 17a and does not penetrate the mask 17 in a second region 17b. A top view of the mask 17 used during the exposing S13 the first resist layer 13 is outlined in FIG. 4a. As depicted in FIG. 4a the outer periphery of the opaque region 17b or the outer periphery of the transparent region 17a can be rectangular.

The light 16 impinges on the material structure 11 in a first region 15a of the first photoresist layer 15, such that the first photoresist material of the first photoresist layer 15 crosslinks in the first region 15a. As the light 16 does not impinge on a surface facing away from the substrate 13 of the first photoresist layer 15 in a second region 15b of the first photoresist layer 15 the first photoresist layer 15 does not crosslink in the second region 15b.

After the exposing S13, the such produced material structure 11 is baked for example in an oven at a temperature in a range from 110° Celsius to 150° Celsius over a period in a range from 300 seconds to 1500 seconds in step S15. During the baking S15, the first photoresist layer 15 further cures in the first region 15a.

Then, a second photoresist layer that includes a second photoresist material having a higher absorption coefficient at a predefined wavelength than the first photoresist material is deposited on the first photoresist layer 15 in step S17. The second photoresist layer can be a continuous layer of the second photoresist material covering the complete surface of the first photoresist layer 15 facing away from the substrate 13. The second photoresist material can, e.g., be formed from an SU-8-resist, such as a negative SU-8 resist wherein the second photoresist layer can have a thickness in a range from 10 µm to 100 µm for example.

Figure 2B:
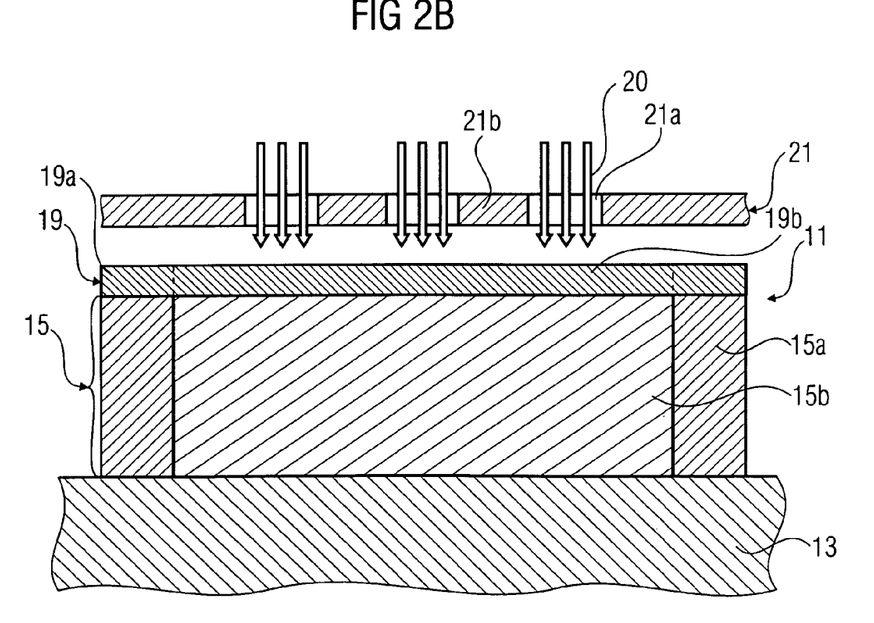

Thereafter, the thus produced material structure 11 is exposed in a step S19, FIG. 2b depicting the part of the material structure 11 during the exposing S19. A second photoresist layer 19 is deposited on the first photoresist layer 15 such that the first photoresist layer 15 is arranged between the substrate 13 and the second photoresist layer 19. The second photoresist layer 19 comprises two different regions a frame region 19a being positioned on top of the first region 15a of the first photoresist layer 15 and a second region 19b being positioned on top of the second region 15b of the first photoresist layer 15.

Figure 4B:
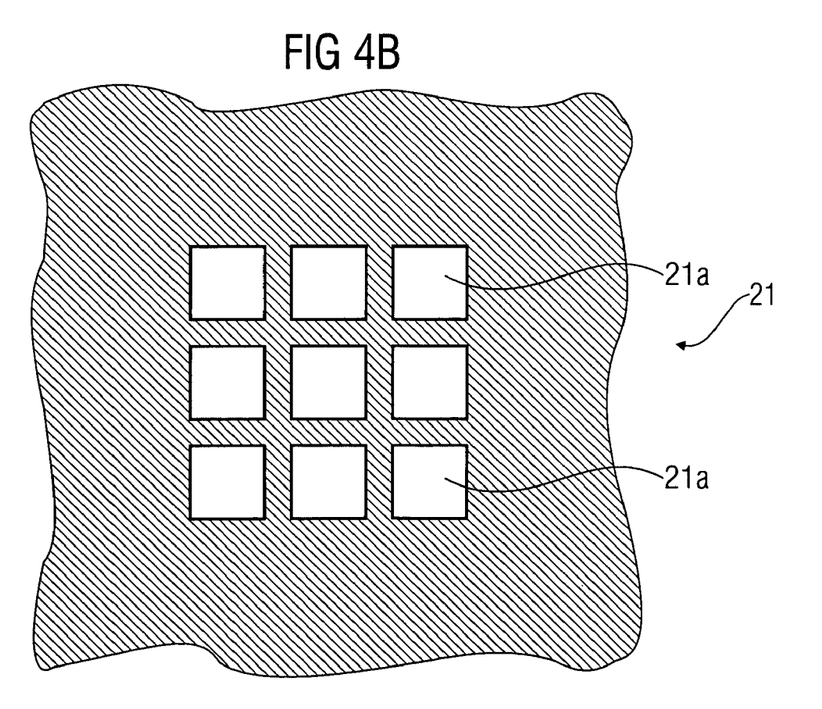

A light 20 which can, e.g., be an i-line light and/or be generated by an i-line stepper penetrates a mask 21 in a first transparent region 21a and impinges on a surface of the second photoresist layer 19 such that the photoresist layer 19 is exposed in a dedicated section. In addition to this, the mask 21 comprises a opaque second region 21b in which the light 20 does not penetrate the mask 21 such that the second photoresist layer 19 is not exposed in another dedicated section. A top view of the mask 21 used for the exposing S19 is shown in FIG. 4b. As can be seen from FIG. 4b, the periphery of the transparent region or the first region 21a of the mask 21 can be rectangular-shaped or even square-shaped. During the exposing the second photoresist material of the second photoresist layer 19 crosslinks in a first partition of the second region 19b of the photoresist layer 19 and does not crosslink in a second partition of the second region 19b in which the light 20 does not impinge on.

Figure 2C:
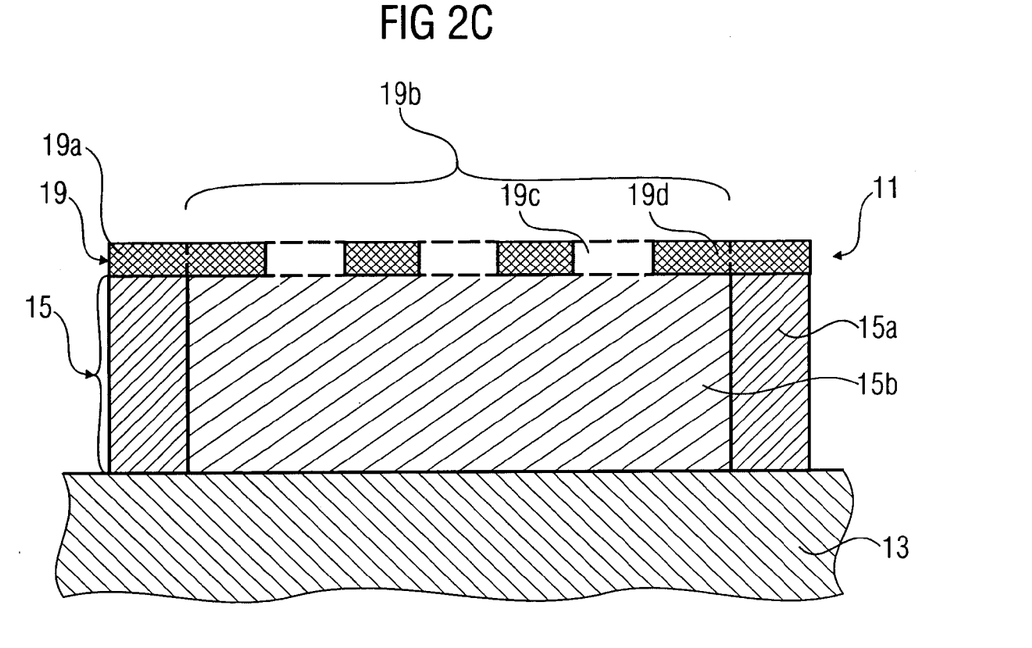

In step S21 the second photoresist layer 19 is exposed in the frame region 19a such that the photoresist layer 19 further crosslinks in the frame region 19a. FIG. 2c shows a view of the material structure 11 after the exposing S21. The thus implemented material structure 11 is also called a support structure. In FIG. 2c, a first partition 19c which has been exposed to the light 20 and a second partition 19d which has not been exposed to the light 20 during the exposing S21 can both be seen wherein the first partition 19c and the second partition 19d form the second region 19b. The material structure 11 shown in FIG. 2c is then baked in step S23, wherein the baking can be performed at a temperature in a range from 120° Celsius to 150° Celsius or over a period from 300 seconds to 1500 seconds.

Figure 2D:
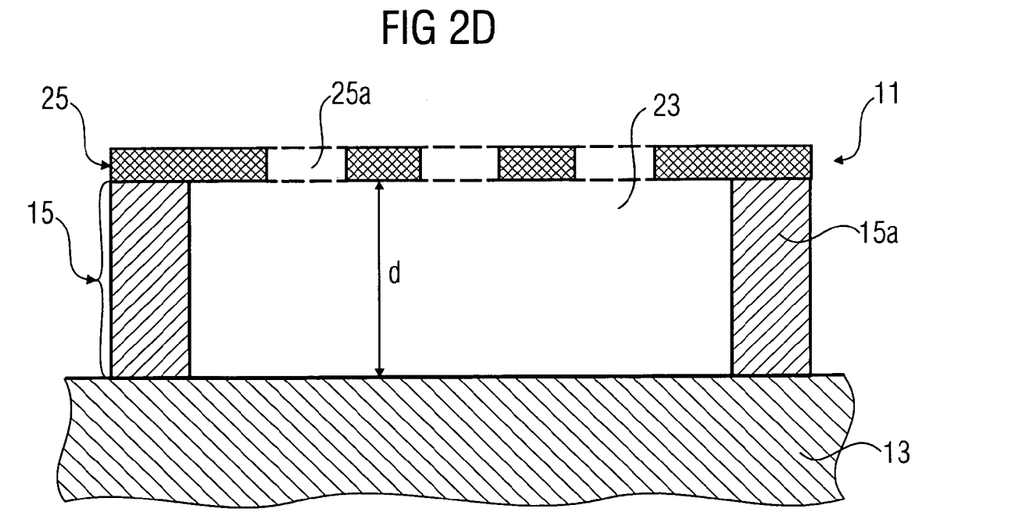

The such produced material structure 11 is then contacted by a developer in step S25 so that the first photoresist material of the first photoresist layer 15 and the second photoresist material of the second photoresist layer 19 are developed and the hence formed material structure 11 is depicted in FIG. 2d. The material structure 11 outlined in FIG. 2d comprises a cavity 23 and a cap 25 with holes 25a in the cap 25 wherein the holes 25a extend from a surface facing the substrate 13 to a surface facing away from the substrate 13. In the material structure 11 the cavity 23 can be formed such that a distance d of the cap portion 25 or a thickness of the first photoresist layer 15 is in a range from 20 μm to 500 μm.

Figure 3:
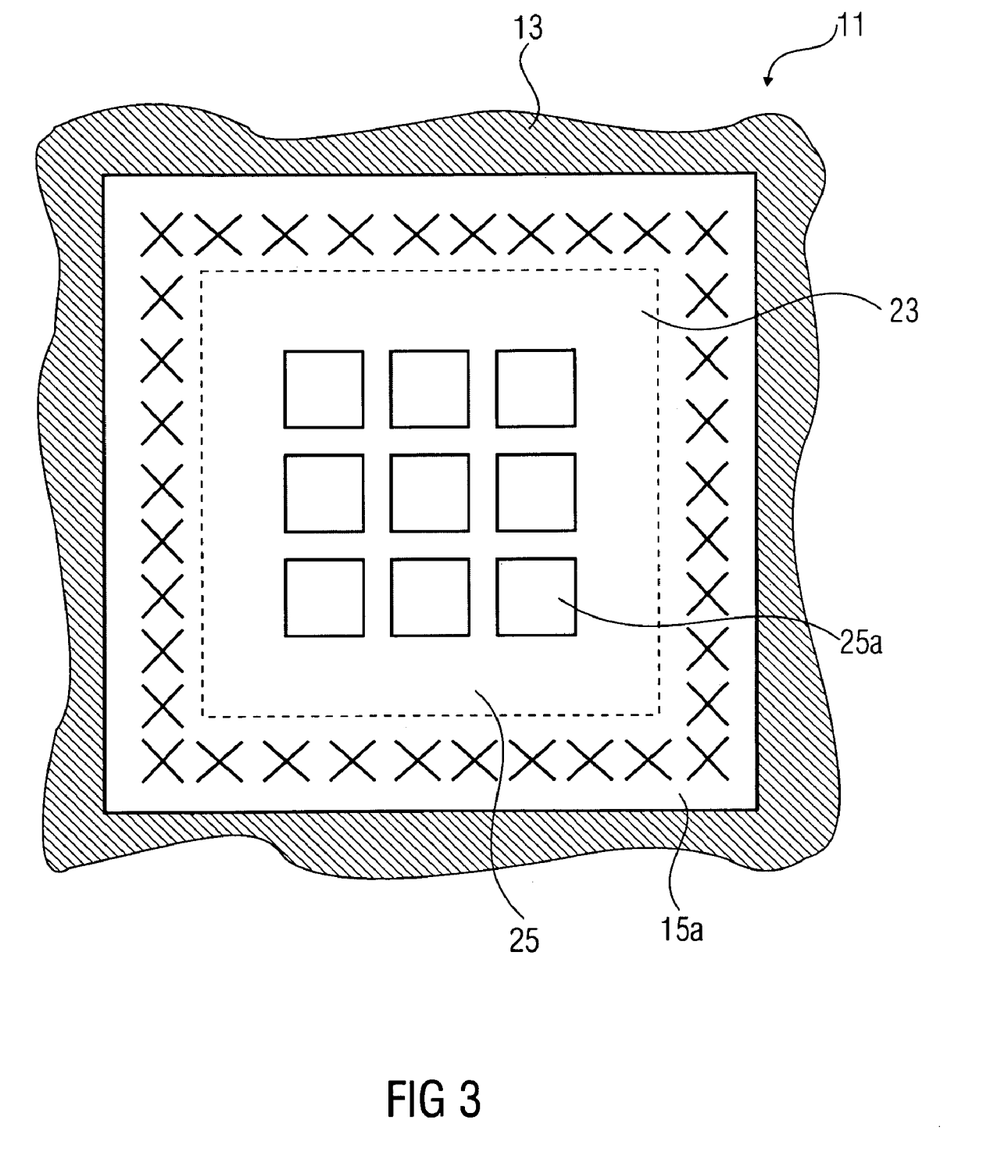
FIG. 3 presents a top view of the material structure outlined in FIG. 2d.

During the developing S25, the second photoresist material of the second photoresist layer 19 has been removed in the first partition 19c of the second photoresist layer 19 such that the holes 25a are formed. After the formation of the holes 25a, the photoresist material of the first photoresist material 15 has been solved by the developer such that the cavity 23 has formed within the material structure 11. A top view of the material structure 11 shown in FIG. 2d is presented in FIG. 3. As can be seen from FIG. 3, the frame portion 15a in the material structure 11 can be rectangular-shaped while an inner periphery of the frame portion 15a covered by the second photoresist layer 19 is indicated by dashed lines and can also be rectangular-shaped. The holes or openings 25a can be rectangular-shaped or even have a square shape. In further steps not depicted in FIG. 1 or FIGS. 2a-d, the material structure 11 shown in FIG. 2d can be sealed by depositing a further photoresist layer on the material structure 11 and optionally patterning the further photoresist layer wherein the further photoresist layer can be arranged such that the holes 25a are completely or partially covered and the cavity 23 is completely or partially sealed.

The material structure 11 shown in FIG. 2d can be used as a WLP (WLP=Wafer Level Package) for a device such as a BAW-resonator (BAW=Bulk Acoustic Wave)-resonator in which a chip can be arranged on the substrate 13 such that a partially or completely sealed cavity is formed within the WLP above the chip on the substrate 13. Such an implemented cavity structure can be thus formed of a material with a high aspect ratio such as, e.g., an SU-8-resist. The first photoresist material or the second photoresist material used in the production of the material structure 11 can be transparent for a dedicated range of wavelength or light wavelength, e.g., for an i-line-light from a halogen lamp.

In the method of producing discussed in FIG. 1, the steps of exposing S13, S19, S21 can be performed by means of an i-line stepper such that the cap 25 is formed during the exposing S19 by means of an i-line-stepper and the frame region 15b of the first photoresist layer 15 is formed in the exposing S13 by means of an i-line stepper. Additionally the exposing S21 the second photoresist layer 19 in the frame region 19a of the second photoresist layer 19 can be performed by means of an i-line stepper.

The method discussed in FIG. 1 can be performed with little effort for the engineering and operation or manufacturing of the material structure 11 as the discussed method of producing enables a comprehensive reproducibility of the exposing steps S13, S19, S21 or the process of exposing hence reducing the disturbing effects of the variations of the thicknesses of the photoresist layers 15, 19 deposited on the substrate 13 or on a wafer. Because all the exposing steps S13, S19, S21 can be performed by means of an i-line stepper the wafers need not be manually adjusted during the production of the material structures 11.

Hence the material structures 11 produced in an embodiment of the method of producing are characterized by a low failure rate or a low density of failures in a plurality of the material structures 11 arranged on a wafer and produced according to the method outlined in FIG. 1 as the effects of a contact exposure can be obviated. Therefore the thus related failures in the masks used for exposing can also be avoided. Thereby, the failures resulting from the contact exposure such as the damages caused to the resist layer deposited on the wafer or the masks can be obviated, as not any masks need be deposited on the wafers themselves in the i-line stepper.

Moreover, the light of the i-line stepper is characterized by a small bandwidth such that the disturbing effects of a light of a high wavelength bandwidth used for exposing during the production of the material structures 11 can be avoided. Apart from this the effects of air bubbles in the photoresist layers 15, 19 on the shape and dimensions of the material structure 11 are decreased.

Figure 5:
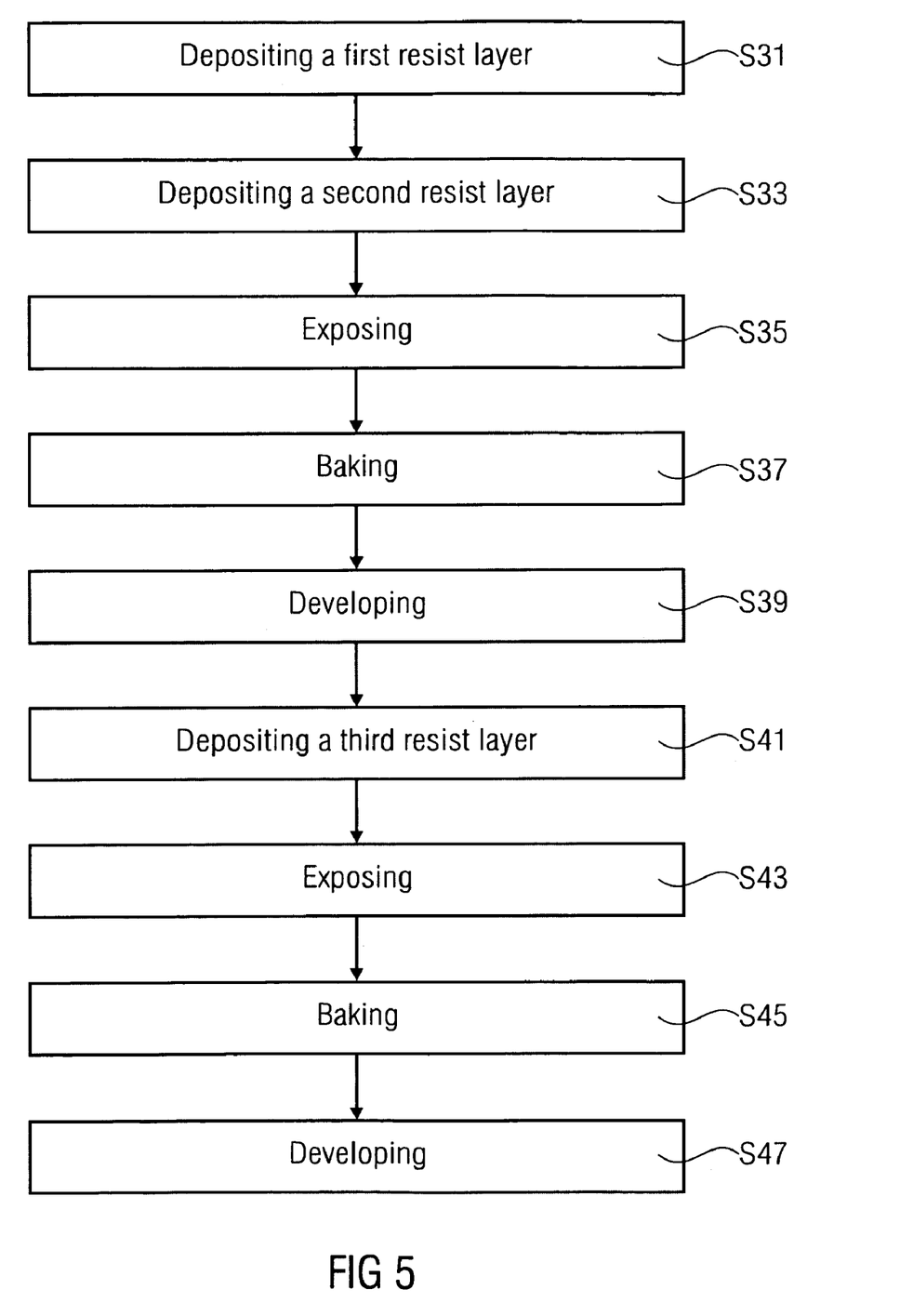
FIG. 5 outlines a further method of producing an apparatus with a cavity on a substrate according to an embodiment.

A further method of producing an apparatus with a material structure is shown in FIG. 5, wherein in the apparatus a photoresist material structure forms together with a substrate a cavity between the substrate and the photoresist material structure. In step S31, a first photoresist layer is deposited on a substrate. The first photoresist layer comprises a first photoresist material, which can, for example, be an SU-8-photoresist such as a negative SU-8 resist. Thereafter, in step S33 a second photoresist layer comprising a second photoresist material is deposited on the first photoresist layer such that the first photoresist layer is arranged between the substrate and the second photoresist layer. The second photoresist material has a higher absorption coefficient at a predefined wavelength than the first photoresist material, wherein the predefined wavelength can be, for example, in a range from 300 μm to 400 μm. A light of such a wavelength can be, e.g., an i-line light generated in a light source in an i-line stepper.

Figure 6A:
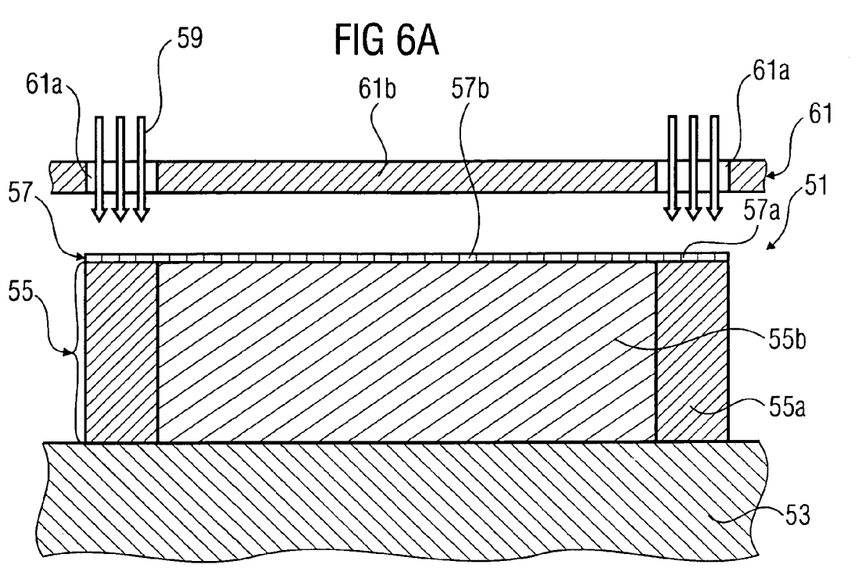
FIGS. 6a-6d are schematic views of the apparatus during the production of the same.

Subsequently, in step S35 the first photoresist layer and the second photoresist layer are exposed such that the first photoresist layer crosslinks in a first region and does not crosslink in a second region. FIG. 6a depicts a schematical cross-sectional view of a part of such a material structure 51 during the exposing S35. The assembly 51 comprises a substrate 53, as for example a wafer, a semiconductor wafer or a silicon wafer onto which a first photoresist layer 55 is deposited. On a surface of the first photoresist layer 55, which is facing away from the substrate 53, a second photoresist layer 57 is deposited wherein the second photoresist layer can have a positive photoresist material, as for example a positive SU-8-resist. A thickness of the second photoresist layer 57 can be, e.g., in a range from 1 μm to 10 μm.

Figure 8A:
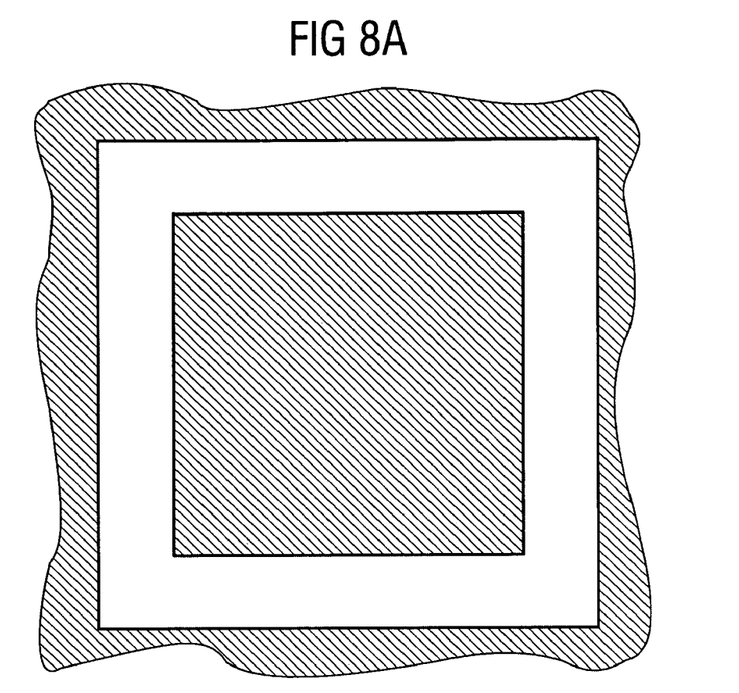
FIGS. 8a-8b depict masks used in the method of producing, outlined in FIG. 5.

A light 59 which can for example be an i-line light generated in a light source of an i-line stepper penetrates a mask 61 in a first transparent region 61a of the mask 61 and does not penetrate the mask 61 in an opaque second region 61b. A top view of the mask 61 is depicted in FIG. 8a, wherein FIG. 8a shows that an outer periphery of the second region or the opaque region 61b of the mask 61 surrounded by the transparent region 61a can be square-shaped, while the outer periphery of the transparent region 61a can be rectangular-shaped or square-shaped, too.

As the first photoresist material of the first photoresist layer 55 can have a negative photoresist material such that during the exposing S35 the first photoresist material 55 crosslinks in a first region 55a in which light rays of the light 59 penetrate and does not crosslink in a second region 55b in which no light rays of the light 59 penetrate. As the second photoresist material can be a positive photoresist, the positive photoresist material of the second photoresist layer 57 can become non-crosslinked in a first region 57a of the second photoresist layer 57, in which the light rays penetrate. Furthermore, the second photoresist layer remains crosslinked in a second region 57b of the second photoresist layer 57 in which no light rays of the light 59 penetrate.

Therefore, after the exposing S35, the material structure 51 has a multilayer structure of two photoresist layers 55, 57 deposited on the substrate 53, wherein the photoresist material of the first photoresist material 55 is crosslinked in a frame region 55a, or a first region 55a and not crosslinked in a second region 55b, and the second photoresist material of the second photoresist 57 is not crosslinked in the first region 57a of the second photoresist layer 57 and crosslinked in the second region 57b of the second photoresist layer 57.

After the exposing S35, the material structure 51 shown in FIG. 3a is baked in step S37, wherein, e.g., the baking can be performed in an oven at a temperature in a range from 110° Celsius to 250° Celsius or over a period in a range from 300 seconds to 1500 seconds. Due to the baking S37, the first photoresist material further cures in the first crosslinked region 55a and the second photoresist material further cures in the crosslinked region 57b. Then, in step S39, the material structure 51 is developed such that the photoresist material of the second photoresist layer 57 is removed in the first region 57a and remains in the second region 57b. Thereafter, in step S41 a third photoresist layer is deposited on a surface of the second photoresist layer 57, the surface of the second photoresist layer 57 facing away from the first photoresist layer 55. In other words, the third photoresist layer is deposited on the second photoresist layer 57 such that the second photoresist layer 57 is arranged between the first photoresist layer 55 and the third photoresist layer. The third photoresist layer can have, for example, an SU-8 resist such as a positive SU-8 resist.

Figure 6B:
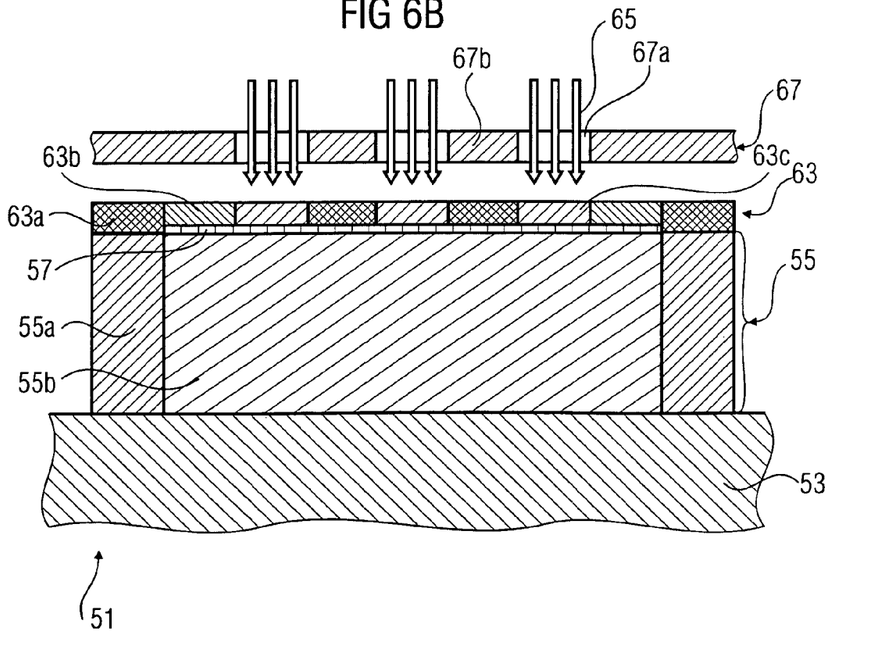

After the depositing S41 the third photoresist layer, the third photoresist layer is exposed in step S43 such that the third photoresist layer is or remains crosslinked in a first partition of the second region and is or becomes non-crosslinked in a second partition of the second region. FIG. 6b depicts a schematic view of the arrangement of the material structure 51 during the exposing S43. As can be seen from FIG. 6b, a third photoresist layer 63 having a third photoresist material is arranged on a surface of the second photoresist layer 57 facing away from the first photoresist layer 55 and on a surface of the first photoresist layer 55 in the first region 55a, the surface of the first photoresist layer 55 facing away from the substrate 53. The third photoresist material can, e.g., have a lower absorption coefficient at a predefined wavelength than the second photoresist material wherein the predefined wavelength can be in a range from 300 nm to 400 nm.

Figure 8B:
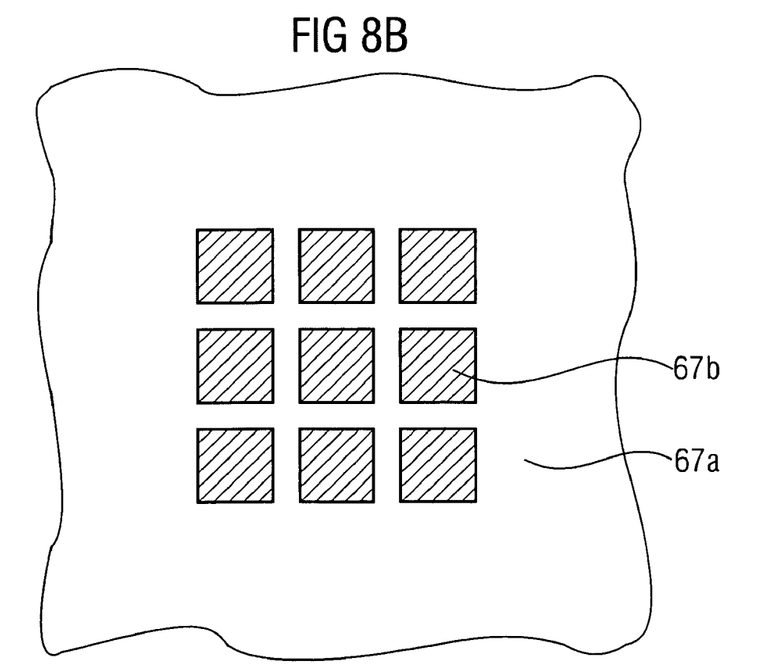

A light 65, like an i-line-light from a light source in an i-line stepper, penetrates a further mask 67 in a first transparent region 67a of the further mask 67 and does not penetrate the further mask 67 in a second opaque region 67b. A top view of the further mask 67 used during the exposing S43 is shown in FIG. 8b. As can be seen from FIG. 8b, the periphery of the transparent region 67a of the mask 67 can be rectangular-shaped or even square-shaped.

Due to the exposing S43, the third photoresist layer 63 comprises a first region or a frame region 63a, which is positioned above the first region 55a of the first photoresist layer 55 and two partitions 63b, 63c, which are positioned above the second region 55b of the first photoresist layer 55 or on the second photoresist layer 57. The third photoresist material of the third photoresist layer remains hereby crosslinked in the first partition 63b in the second region and softens or fluidifies in the second partition 63c due to the exposing S43 such that the third photoresist layer 63 is non-crosslinked in the second partition 63c after the exposing S43.

The periphery and the dimensions of the second partitions 63c are defined by the area in which the light penetrates the mask 67 and impinges on the surface of the third photoresist layer 63.

The doses of exposure, the absorption capabilities of the second photoresist layer 57 and the third photoresist layer 63, or the absorption characteristics of the second photoresist material and the third photoresist material are selected such that the light 65 does not penetrate the second photoresist layer 57 and the third photoresist layer 63, or that only a small portion of light 65 penetrates into the first photoresist layer 55 during the exposing S43. For example in a method of producing the second photoresist layer 57 or the third photoresist layer 63 can be implemented such that 95% of an intensity or an energy of light impinging on the surface of the third photoresist layer 63 facing away from the second photoresist layer 57 is absorbed by the second photoresist layer 57 or the third photoresist layer 63, such that only 5% of the intensity or energy of the light penetrates into the first photoresist layer 55.

Figure 6C:
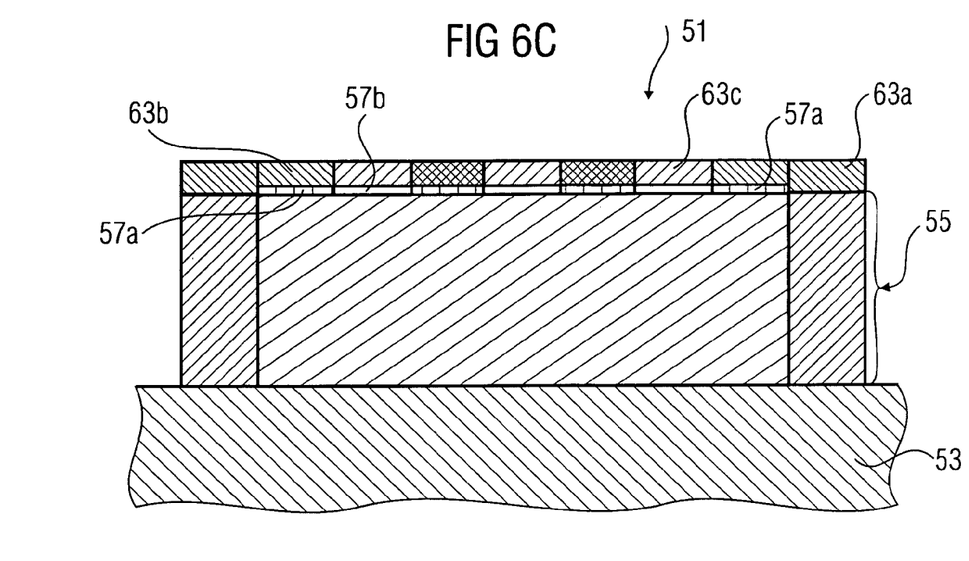

FIG. 6c depicts a cross-sectional view of the material structure 51, after the exposing S43. It can be seen in FIG. 6c that the second photoresist layer 57 includes two different partitions 57a, 57b, the first partition 57a in which the second photoresist material has remained crosslinked during the exposing S43, and the second partition 57b in which the second photoresist material has become softened or fluidified after the exposing S43. The periphery or the dimensions of the second partition 57b in which the second photoresist material is non-crosslinked after the exposing S43 is defined by the area in which the light 65 penetrates into the second photoresist layer 57 during the exposing S43.

Figure 7:
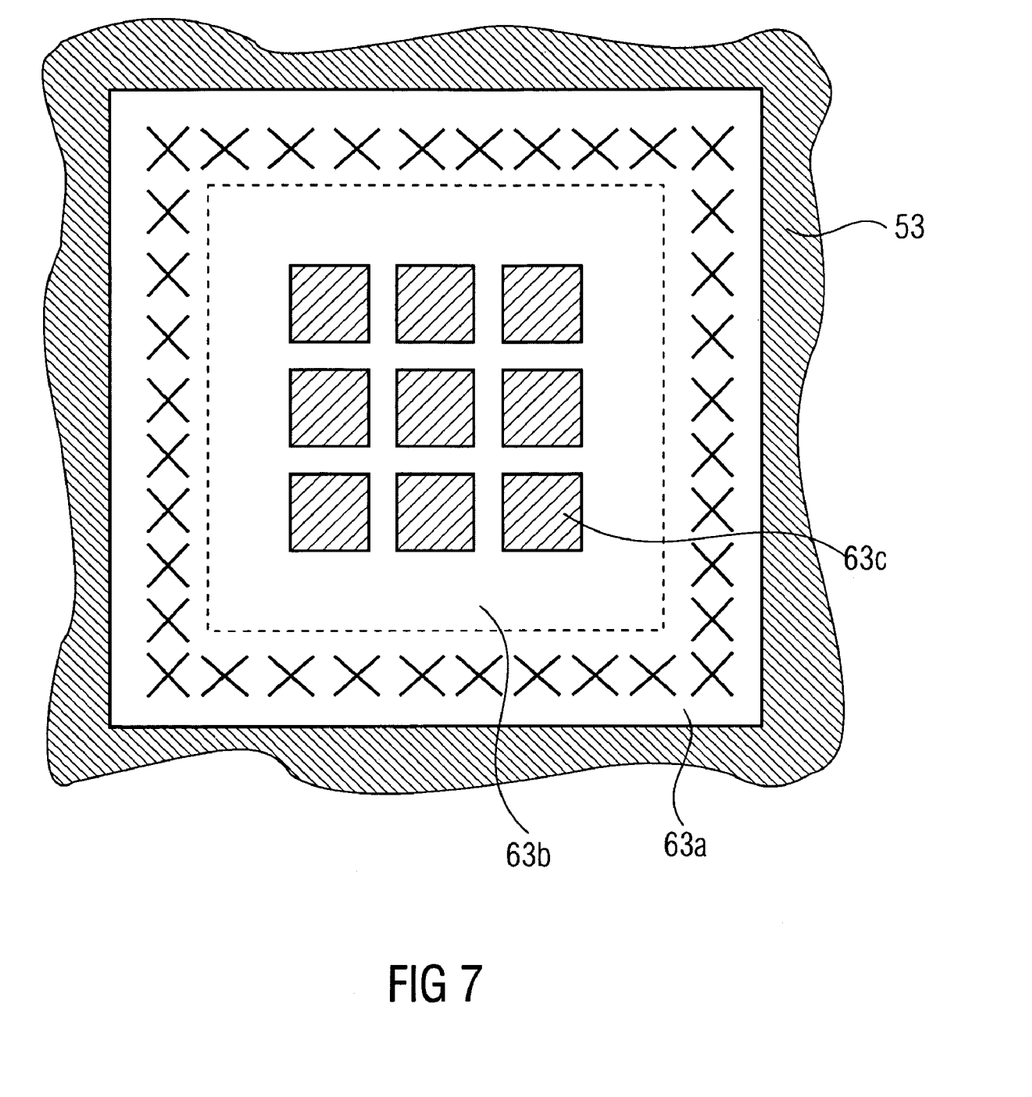
FIG. 7 shows a top view of the material structure as shown in FIG. 6b.

In FIG. 7 a top view on the material structure 51 outlined in FIG. 6c is shown wherein an inner periphery of the first region 63a of the third photoresist layer is depicted with dashed lines. As can be seen from FIG. 7 an outer periphery of the second partition 63c, the inner periphery of the first region 63a or the outer periphery of the second region 63b of the third photoresist layer can be rectangular-shaped or even square-shaped.

Figure 6D:
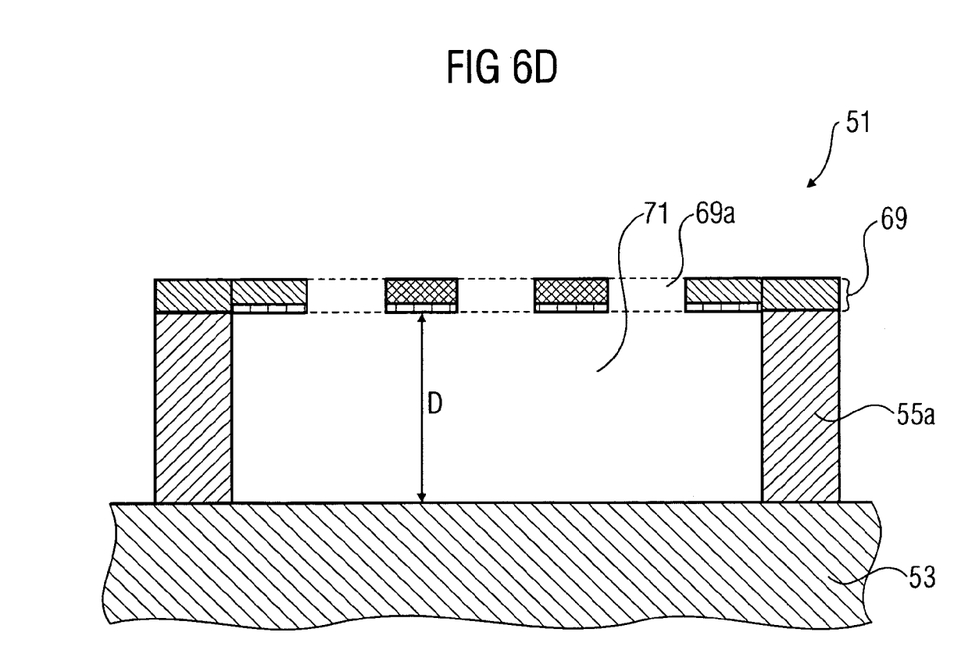

Then the material structure 51 shown in FIG. 6c can for example be baked in an oven in step S45, wherein the baking is e.g. performed at a temperature in a range from 110° Celsius to 150° Celsius or over a period in a range from 300 seconds to 1500 seconds. After the baking S45, the material structure 51 is contacted by a developer in step S47 such that the first photoresist material, the second photoresist material or the third photoresist material is developed. FIG. 6d shows a set-up of the material structure 51 after the developing S47.

As can be seen from FIG. 6d, the material structure 51 comprises the substrate 53 and a multilayer photoresist material structure. The multilayer photoresist structure in turn is formed of the three photoresist layers 55, 57, 63 arranged on a main side of the substrate 53. The material structure 51 has the frame region 55a of the first photoresist layer 55 and a cap portion 69 including the regions and partitions 57a, 57b, 63a, 63b, 63c of the second photoresist layer 57 and the third photoresist layer 63.

The cap portion 69 is positioned on the frame portion 55a formed on the main side of the substrate 53, such that the cap portion spans over a part of the main side of the substrate at a distance to the main side, such that a cavity 71 is formed wherein the cavity 71 is surrounded by the substrate 53, the frame region or frame portion 55a and the cap portion 69. The cavity 71 can, e.g., be formed such that a distance D of the cap portion 69 from the substrate 53 or a thickness of the first photoresist layer 55 is in a range from 20 μm to 500 μm. As can be seen from FIG. 6d, the cap portion 69 comprises several holes 69a or openings, which enable the removal of the sacrificial material of the first photoresist material in the second region 55b wherein the holes 69a extend from a surface of the cap portion 69 facing the substrate 53 to a surface of the cap portion 69 facing away from the substrate 53.

Therefore, during the developing S47, the material is etched or solved in the developer via the opening 69a across which the developer contacts the first photoresist material in the second region 55b. In a further step of the method of producing outlined in FIG. 5 a fourth photoresist material layer could be deposited on the material structure 51 shown in FIG. 6d such that the holes 69a can be partially or completely covered by the fourth photoresist layer. In a further photolithographic step, which could also be performed by means of an i-line stepper, the fourth photoresist layer could be patterned. Hence, the cavity 71 in the material structure 51 could be partially or completely sealed by the fourth photoresist layer not shown in the FIG. 6d.

As the exposing S35, the exposing S43, and/or the optional exposing the fourth photoresist layer can each be performed in an i-line stepper, the method of producing can be carried out in a simple way as already outlined above.

Figure 9:
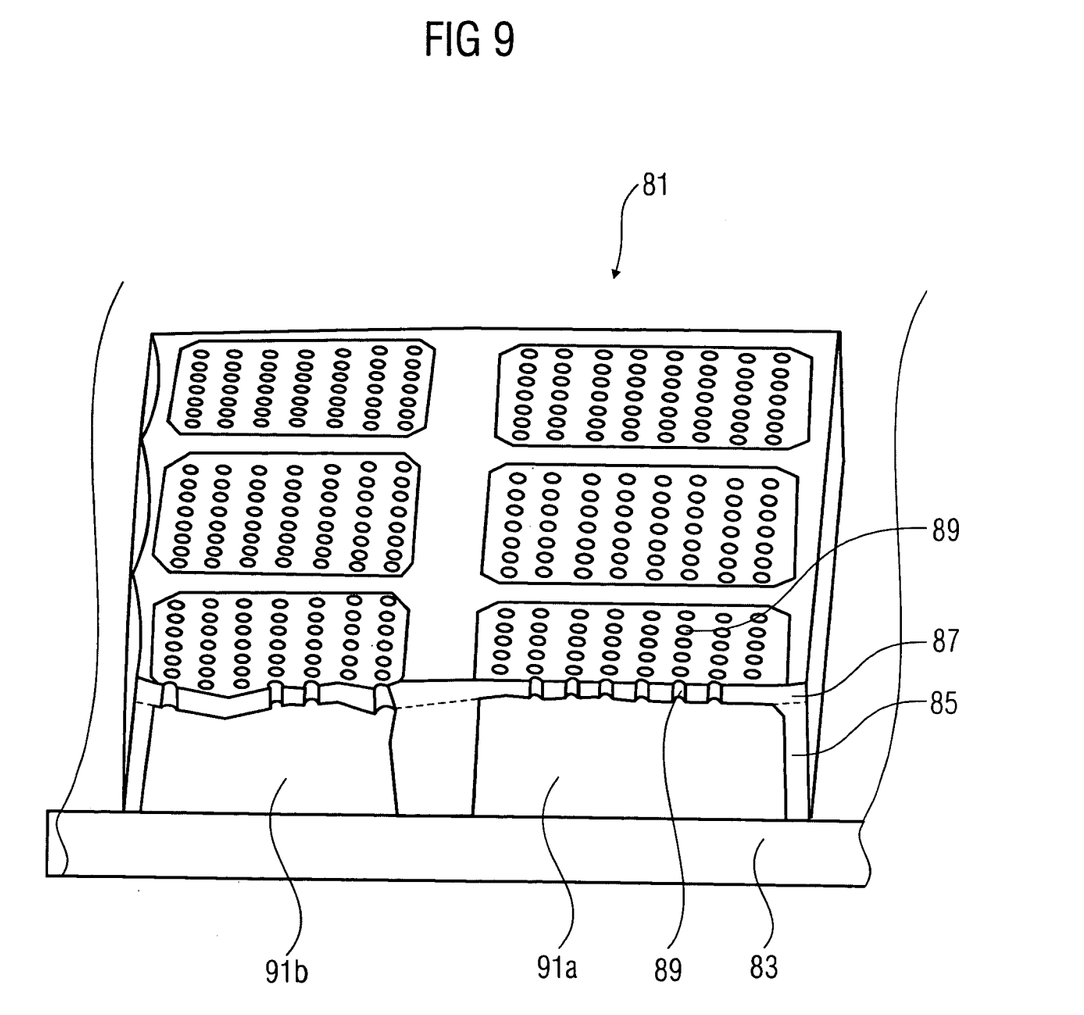
FIG. 9 shows a photographic view of an apparatus.

The methods outlined in FIGS. 1 and 5 can be used to produce a plurality 81 of WLPs on a wafer 83. The group or the plurality 81 of the WLPs on the substrate 83 is shown in FIG. 9. As can be seen from FIG. 9, the WLP comprises a frame portion 85 and a cap portion 87 with several holes 89 in the cap portion 87. A first cavity 91a is surrounded by the wafer 83, the frame portion 85 and the cap portion 87 while FIG. 9 also shows a second cavity 91b of an adjacent WLP.

In an embodiment of an apparatus having the WLP lateral dimensions or an extension of the cavity 91a, 91b in a direction parallel to a surface of a wafer 83 can be in a range from 20 µm to 1000 µm, or in a range from 100 µm and 400 µm. A distance of the cap portion 87 from a surface of the wafer 83, or a minimum of a distance between a point on a surface of the substrate 83 facing the cap portion 87 and a point of the cap portion 87 can be in a range from 10 µm to 500 µm or in a range from 50 µm to 250 µm.

The substrates 13, 53, 83 can have any material like a semiconductor material such as a silicon or a GaAs. The first photoresist material of the first photoresist layer 15 in the material structure 11 can be for example, a negative photoresist such as an SU-8-resist. However, any arbitrary photoresist materials or even a positive resist are alternatives for this. The second photoresist material of the second photoresist layer 19 can be a positive photoresist material such as a positive SU-8. However, any arbitrary photoresist materials or even a negative photoresist material are alternatives for this.

In the material structure 51, the first photoresist material of a first photoresist layer 55 can comprise a negative photoresist material, e.g., a negative SU-8 photoresist material. Conversely, any photoresist materials or even a positive photoresist material are alternatives for this. Furthermore, the photoresist material of the second photoresist layer 57 in the material structure 51 can comprise a positive photoresist material such as a positive SU-8 photoresist. However, any kind of photoresist material such as a negative photoresist material can be an alternative for this.

Additionally, the photoresist material of the third photoresist material 63 can have a positive photoresist, e.g. a positive SU-8 resist, on the other hand any photoresist material, e.g. even a negative resist material, can be an alternative for this. Besides this, the photoresist material of the second photoresist layer 57 and the third photoresist material of the third photoresist layer 63 can be of opposite types in an alternative embodiment, such that the second photoresist material can be a negative resist material and the third photoresist material a positive resist material or vice-versa.

In the material structure 11, a ratio of the absorption coefficient of the second photoresist material of the second photoresist layer 19 to an absorption coefficient of the first photoresist material of the first photoresist layer 15 can be in a range from 5 to 100. However, any ratios of the absorption coefficient of the second photoresist material to the absorption coefficient of the first photoresist material are alternatives for this as long as the absorption coefficient of the second photoresist material is higher than the absorption coefficient of the first photoresist material at a predefined wavelength. The predefined wavelength can be in a range from 300 nm to 400 nm; however any values of the predefined wavelength can be alternatives hereto.

In the material structure 51, a ratio of the absorption coefficient of the second photoresist material of the second photoresist layer 57 to an absorption coefficient of the first photoresist material of the first photoresist layer 55 can be in a range from 5 to 100 at a predefined wavelength, nevertheless, any ratios of the absorption coefficient of the second photoresist material to the absorption coefficient of the first photoresist material are alternatives hereto. The predefined wavelength can be in a range between 300 nm and 400 nm, on the other hand, any wavelength values are alternatives hereto. Moreover, a ratio of an absorption coefficient of the second photoresist material of the second photoresist layer 57 to an absorption coefficient of the third photoresist material of the third photoresist layer 63 can be in a range from 5 to 100, wherein the predefined wavelength can be in a range from 300 nm to 400 nm. Nevertheless, any values of the ratio of the absorption coefficient of the second photoresist material to the absorption coefficient of the third photoresist material are alternatives while any values for the predefined wavelengths are feasible.

In the material structure 11, the second photoresist layer 19 can be implemented such that more than 95% of an energy of the light 20 impinging on a surface of the second photoresist layer 19 facing away from the first photoresist layer is absorbed by the first photoresist layer, wherein a wavelength of the impinging light can be in a range from 300 nm to 400 nm. However, any implementations of the material structure 11 with the second photoresist material having a higher absorption coefficient than the first photoresist material at a predefined wavelength are alternatives for this. In the material structure 51, the second photoresist layer 57 or the third photoresist layer 63 can be implemented such that more than 95% of an energy of a light impinging on the surface of the third photoresist layer 63 facing away from the second photoresist layer, is absorbed by the second photoresist layer 57 or the third photoresist layer 63, wherein a wavelength of the impinging light can be in a range between 300 nm and 400 nm. Conversely, any implementations of the second photoresist layer or the third photoresist layer are alternatives for this.

In the material structures 11, 51 a thickness of the first photoresist layer 15, 55 can be in a range between 20 µm and 500 µm, however, any values of the thickness of the first photoresist layer 15, 55 are alternatives for this. In the material structure 11, the thickness of the second photoresist layer 19 can be in a range from 10 µm to 100 µm, however, any values of the thickness of the second photoresist layer 19 can be alternatives for this.

Moreover, the thickness of the second photoresist layer 57 in a material structure 51 can have a value in a range from 1 µm to 10 µm, but any values of the thickness of the second photoresist layer 57 are feasible. Additionally, the thickness of the third photoresist layer 63 can be in a range from 10 μm to 100 μm, nevertheless, any values of the thickness of the third photoresist layer 63 are feasible. In the material structures 11, 51 of an apparatus a ratio of the thickness of the frame portions 15a, 55a of the first photoresist layer to a thickness of the cap portions 25, 69 can be in a range from 2 to 20, but any values of the ratio of the thickness of the frame portions 15a, 55a, to the thickness of the cap portions 25, 69 are alternatives for this. Further in the material structures 11, 51 in an embodiment of an apparatus a ratio of a maximum distance between two points on the lateral outer periphery of the frame portion 15a, 55a to the thickness of the frame portions 15a, 55a can be in a range between 4 to 1000, nevertheless any values of the ratio are alternatives for this. In the material structures 11, 51 a maximum distance between two points of an outer periphery of the frame portion 55a can be in a range from 10 μm to 1000 μm, but any values of the maximum distance can be alternatives for this.

In the method of producing an apparatus comprising a material structure as discussed in FIG. 1, the steps of baking S15, S23 or the step S21 of exposing the frame region 15a can be left out in an alternative embodiment of the method of producing. Additionally, the sequence of the steps can be changed or any other steps can be carried out between two method steps in an alternative embodiment of a method of producing an apparatus.

Moreover, in the method of producing outlined in FIG. 5, the baking S37, S45 can be left out. Besides this, any further method steps can be carried out in a method of producing an apparatus in an alternative embodiment of the method and the sequence of the steps can be changed in an alternative embodiment of the method.

Further in a method of producing the baking S15, S23, S37, S45 can be carried out at any temperature over an arbitrary period.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus comprising:
   a substrate with a main side;
   a photoresist material structure arranged adjacent to the substrate so that a cavity is formed between the substrate and the photoresist material structure, the cavity having an opening;
   wherein the photoresist material structure comprises a frame portion disposed on the main side of the substrate and a cap portion spanning over a part of the main side of the substrate at a distance to the main side; and
   wherein the photoresist material structure is formed of a first photoresist layer and a second photoresist layer in direct contact with each other, wherein the cap portion is formed in the first photoresist layer and the frame portion is formed in the second photoresist layer and the first photoresist layer comprises a first photoresist material and the second photoresist layer comprises a second photoresist material, the first photoresist material being a positive resist, the second photoresist material being a negative resist and the first photoresist material having a higher absorption coefficient than the second photoresist material at a predefined wavelength.

2. The apparatus according to claim 1, wherein the predefined wavelength is in a range from 300 nm to 400 nm.

3. The apparatus according to claim 1, wherein the first photoresist layer is embodied such that at least 95% of an energy of a light beam impinging on a surface of the first photoresist layer facing away from the second photoresist layer is absorbed by the first photoresist layer.

4. The apparatus according to claim 1, wherein a ratio of the absorption coefficient of the first photoresist material to the absorption coefficient of the second photoresist material is in a range from 5 to 100.

5. The apparatus according to claim 1, wherein a thickness of the first photoresist layer is in a range from 10 μm to 100 μm.

6. The apparatus according to claim 1, further comprising a third photoresist layer, wherein the third photoresist layer is arranged such that the first photoresist layer is positioned between the third photoresist layer and the second photoresist layer and the opening is completely covered by the third photoresist layer such that a sealed cavity is formed in the photoresist material structure.

7. An apparatus comprising:
   a substrate with a main side; and
   a photoresist material structure disposed adjacent to the substrate such that a cavity is formed between the substrate and the photoresist material structure, the cavity having an opening;
   wherein the photoresist material structure comprises a frame portion formed on the main side of the substrate and a cap portion spanning over a part of the main side of the substrate at a distance to the main side and comprising the opening;
   wherein the photoresist material structure is formed of a first photoresist layer, a second photoresist layer and a third photoresist layer in direct contact with each other;
   wherein the cap portion is formed in the first photoresist layer and the frame portion is formed in the second photoresist layer;
   wherein the third photoresist layer is disposed in at least in a region of the cap portion between the first photoresist layer and the second photoresist layer; and
   wherein the third photoresist layer has a higher absorption coefficient at a predefined wavelength than the second photoresist layer.

8. The apparatus according to claim 7, wherein the predefined wavelength is in a range from 300 nm to 400 nm.

9. The apparatus according to claim 7, wherein the third photoresist layer is embodied such that at least 95% of an energy of a light beam impinging on a surface of the third photoresist layer facing away from the second photoresist layer is absorbed by the third photoresist layer.

10. The apparatus according to claim 7, wherein a ratio of an absorption coefficient of the third photoresist layer to an absorption coefficient of the second photoresist layer is in a range from 5 to 100.

11. The apparatus according to claim 7, wherein the third photoresist layer has a higher absorption coefficient at a predefined wavelength than the first photoresist layer.

12. The apparatus according to claim 11, wherein a ratio of the absorption coefficient of the third photoresist layer to the absorption coefficient of the first photoresist layer is in a range from 5 to 100.

13. The apparatus according to claim 7, wherein a thickness of the third photoresist layer is in a range from 1 μm to 10 μm.

14. The apparatus according to claim 7, further comprising a fourth photoresist layer, wherein the fourth photoresist layer is arranged such that the first photoresist layer is positioned between the second photoresist layer and the fourth photoresist layer and the opening is completely covered by the fourth photoresist layer such that a sealed cavity is formed in the photoresist material structure.

15. The apparatus according to claim 7, wherein the third photoresist layer comprises a positive resist.

16. The apparatus according to claim 7, wherein the second photoresist layer comprises a negative resist.

17. The apparatus according to claim 7, wherein the first photoresist layer comprises a positive resist.

18. The apparatus according to claim 7, wherein the third photoresist layer comprises an SU-8 resist.

19. The apparatus according to claim 7, wherein the first photoresist layer borders on the frame portion of the second photoresist layer.

20. A method of producing a device, the method comprising:
depositing a first photoresist layer over a substrate, wherein the first photoresist layer comprises a first photoresist material;
exposing the first photoresist layer such that the first photoresist layer crosslinks in a first region and does not crosslink in a second region;
after exposing the first photoresist layer, depositing a second photoresist layer over the first photoresist layer and in direct contact with the first photoresist layer, wherein the second photoresist layer comprises a second photoresist material having a higher absorption coefficient at a predefined wavelength than the first photoresist material;
exposing the second photoresist layer at the predefined wavelength such that the second photoresist material is crosslinked in a first partition of the second region and is not crosslinked in a second partition of the second region; and
developing the first photoresist material and the second photoresist material.

21. The method according to claim 20, wherein exposing the first photoresist layer is performed by selective radiation of light in an i-line stepper.

22. The method according to claim 20, wherein exposing the second photoresist layer is performed by selective radiation of light in an i-line stepper.

23. The method according to claim 20, further comprising performing a first baking after exposing the first photoresist layer but before depositing the second photoresist layer, the first baking being carried out over a period in a range from 300 sec. to 1500 sec. at a temperature in a range from 110° C. to 150° C.

24. The method according to claim 20, further comprising performing a second baking after exposing the second photoresist layer but before developing the first photoresist material and the second photoresist material, the second baking being carried out over a period in a range from 300 sec. to 1500 sec. at a temperature in a range from 110° C. to 150° C.

25. The method according to claim 20, wherein the predefined wavelength is in a range from 300 nm to 400 nm.

26. The method according to claim 20, wherein the first photoresist material comprises a positive resist.

27. The method according to claim 26, wherein the second photoresist material comprises a negative resist.

28. The method according to claim 20, wherein the second photoresist layer is embodied such that at least 95% of an energy of a light beam impinging on a surface of the second photoresist layer facing away from the first photoresist layer is absorbed by the second photoresist layer.

29. The method according to claim 20, wherein the second photoresist layer has a thickness in a range from 10 μm to 100 μm.

30. The method according to claim 20, wherein the developing comprises removing a non-crosslinked portion of the first photoresist material in the second region by means of contacting the first photoresist material with a developer through an opening in the second photoresist layer.

31. The method according to claim 20, further comprising depositing a third photoresist layer after developing, the third photoresist layer being deposited such that it covers the opening, wherein the developing comprises a forming of a cavity surrounded by the substrate, a frame portion formed in the first photoresist layer and a cap portion formed in the second photoresist layer.

32. A method of producing a device, the method comprising:
depositing a first photoresist layer over a substrate, wherein the first photoresist layer comprises a negative resist;
exposing the first photoresist layer such that the first photoresist layer crosslinks in a first region and does not crosslink in a second region;
after exposing the first photoresist layer, depositing a second photoresist layer over the first photoresist layer and in direct contact with the first photoresist layer, wherein the second photoresist layer comprises a second photoresist material, the second photoresist material having a higher absorption coefficient at a predefined wavelength than the first photoresist material;
exposing the second photoresist layer at the predefined wavelength at least within a portion of the second region; and
developing the first photoresist material and the second photoresist material.

33. The method according to claim 32, wherein exposing the first photoresist layer is performed by selective radiation of light in an i-line stepper.

34. The method according to claim 33, wherein exposing the second photoresist layer is performed by selective radiation of light in an i-line stepper.

35. The method according to claim 32, further comprising performing a first baking after the depositing the first photoresist layer but before the depositing the second photoresist layer, the first baking being carried out over a period in a range from 300 sec. to 1500 sec. at a temperature in a range from 110° C. to 150° C.

36. The method according to claim 35, further comprising performing a second baking after exposing the second photoresist layer but before the developing, the second baking being carried out over a period in a range from 300 sec. to 1500 sec. at a temperature in a range from 110° C. to 150° C.

37. The method according to claim 32, wherein the predefined wavelength is in a range from 300 nm to 400 nm.

38. The method according to claim 32, wherein the second photoresist layer is embodied such that at least 95% of energy of a light beam impinging on a surface of the second photoresist layer facing away from the first photoresist layer is absorbed by the second photoresist layer.

39. The method according to claim 32, wherein the second photoresist layer has a thickness in a range from 10 μm to 100 μm.

40. The method according to claim 32, wherein the developing comprises removing a non-crosslinked portion of the first photoresist material in the second region by contacting the first photoresist material with a developer through the opening.

41. A method of producing a device, the method comprising:
- depositing a first photoresist layer over a substrate, wherein the first photoresist layer consists of a first photoresist material;
- depositing a second photoresist layer over the first photoresist layer and in direct contact with the first photoresist layer, wherein the second photoresist layer consists of a second photoresist material that has a higher absorption coefficient at a predefined wavelength than the first photoresist material;
- performing of an exposure of the first photoresist layer and the second photoresist layer such that the first photoresist layer crosslinks in a first region and does not crosslink in a second region;
- depositing a third photoresist layer over the second photoresist layer, wherein the third photoresist layer comprises a third photoresist material;
- exposing the third photoresist layer such that the third photoresist layer is crosslinked in a first partition of the second region and is not crosslinked in a second partition of the second region; and
- developing the third photoresist material.

42. The method according to claim 41, further comprising developing the first photoresist material and the second photoresist material after the performing of the exposure of the first photoresist layer and the second photoresist layer.

43. The method according to claim 41, wherein the exposure of the first photoresist layer and the second photoresist layer is performed by selective radiation of light in an i-line stepper.

44. The method according to claim 41, wherein exposing the third photoresist layer is performed by selective radiation of light in an i-line stepper.

45. The method according to claim 41, further comprising performing a first baking after the exposing the first photoresist layer and the second photoresist layer, the first baking being carried out over a period in a range from 300 sec. to 1500 sec. at a temperature in a range from 110° C. to 150° C.

46. The method according to claim 41, further comprising performing a second baking, after the exposing of the third photoresist layer, the second baking being carried out over a period in a range from 300 sec. to 1500 sec. at a temperature in a range from 110° C. to 150° C.

47. The method according to claim 41, wherein developing the first photoresist material and the second photoresist material comprises removing the second photoresist material in the first region.

48. The method according to claim 41, wherein the second photoresist layer has a thickness in a range from 1 μm to 10 μm.

49. The method according to claim 41, wherein the predefined wavelength is in a range from 300 nm to 400 nm.

50. The method according to claim 41, wherein the second photoresist layer is deposited such that at least 95% of energy of a light beam impinging on a surface of the second photoresist layer facing away from the first photoresist layer is absorbed by the second photoresist layer.

51. An apparatus comprising:
- a substrate with a main side;
- a photoresist material structure arranged adjacent to the substrate so that a cavity is formed between the substrate and the photoresist material structure, the cavity having an opening;
- wherein the photoresist material structure comprises a frame portion disposed on the main side of the substrate and a cap portion spanning over a part of the main side of the substrate at a distance to the main side; and
- wherein the photoresist material structure is formed of a first photoresist layer and a second photoresist layer, wherein the cap portion is formed in the first photoresist layer and the frame portion is formed in the second photoresist layer and the first photoresist layer comprises a first photoresist material and the second photoresist layer comprises a second photoresist material, the first photoresist material being a positive resist, the second photoresist material being a negative resist and the first photoresist material having a higher absorption coefficient than the second photoresist material at a predefined wavelength,
- further comprising a third photoresist layer, wherein the third photoresist layer is arranged such that the first photoresist layer is positioned between the third photoresist layer and the second photoresist layer and the opening is completely covered by the second photoresist layer such that a sealed cavity is formed in the photoresist material structure.

* * * * *